United States Patent
Lin et al.

(10) Patent No.: US 8,122,179 B2
(45) Date of Patent: Feb. 21, 2012

(54) MEMORY APPARATUS AND METHOD OF EVENLY USING THE BLOCKS OF A FLASH MEMORY

(75) Inventors: Chien-Cheng Lin, Yi-Lan (TW); Wen-Chung Chang, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 464 days.

(21) Appl. No.: 11/956,485

(22) Filed: Dec. 14, 2007

(65) Prior Publication Data

US 2009/0157947 A1    Jun. 18, 2009

(51) Int. Cl.
*G06F 13/00*    (2006.01)
(52) U.S. Cl. .................................. 711/103; 711/E12.008
(58) Field of Classification Search .......................... None
See application file for complete search history.

(56) References Cited

U.S. PATENT DOCUMENTS

| | | | | |
|---|---|---|---|---|
| 6,081,447 | A * | 6/2000 | Lofgren et al. | 365/185.02 |
| 6,230,233 | B1 * | 5/2001 | Lofgren et al. | 711/103 |
| 6,594,183 | B1 * | 7/2003 | Lofgren et al. | 365/185.33 |
| 6,850,443 | B2 * | 2/2005 | Lofgren et al. | 365/185.29 |
| 7,188,228 | B1 | 3/2007 | Chang et al. | |
| 2001/0054129 | A1 | 12/2001 | Wouters | |
| 2003/0227804 | A1 | 12/2003 | Lofgren et al. | |
| 2004/0139282 | A1 * | 7/2004 | Yoshioka et al. | 711/133 |
| 2005/0055532 | A1 * | 3/2005 | Yu | 711/203 |
| 2005/0114589 | A1 * | 5/2005 | Lofgren et al. | 711/103 |
| 2007/0150694 | A1 * | 6/2007 | Chang et al. | 711/202 |
| 2007/0300009 | A1 * | 12/2007 | Rogers et al. | 711/103 |
| 2009/0182936 | A1 * | 7/2009 | Lee | 711/103 |
| 2009/0287875 | A1 * | 11/2009 | Lin | 711/103 |
| 2010/0037001 | A1 * | 2/2010 | Langlois et al. | 711/103 |
| 2010/0100663 | A1 * | 4/2010 | Kao et al. | 711/103 |
| 2010/0172179 | A1 * | 7/2010 | Gorobets et al. | 365/185.09 |
| 2010/0293320 | A1 * | 11/2010 | Li et al. | 711/103 |

FOREIGN PATENT DOCUMENTS

| | | |
|---|---|---|
| CN | 1383510 | 12/2002 |
| GB | 2291990 A * | 2/1996 |

OTHER PUBLICATIONS

"Wear Leveling in Single Level Cell NAND Flash Memories," Nov. 2004, STMicrosystems, Application Note AN1822, p. 4.*
Office Action from corresponding Chinese Application No. 200810109968.2 dated Jun. 17, 2010. English machine translation attached.
"Wear Leveling in Single Level Cell NAND Flash Memories", AN1822 Application Note, Nov. 30, 2004.

* cited by examiner

*Primary Examiner* — Pierre-Michel Bataille
*Assistant Examiner* — Sean D Rossiter
(74) *Attorney, Agent, or Firm* — Ditthavong Mori & Steiner, P.C.

(57) ABSTRACT

A memory apparatus and a method of evenly using the blocks of a flash memory are provided. The memory apparatus comprises a flash memory and a controller. The flash memory comprises a data region with a plurality of data blocks and a spare region with a plurality of spare blocks. The controller is configured to receive data corresponding to the first data block, select a spare block, program data into the spare block when the erase count corresponding to the spare block is less than the predetermined value or to select a second data block and program data stored in the second data block into the spare block when the erased count corresponding to the spare block reaches the predetermined value. As a result, the blocks of the flash memory are used evenly.

12 Claims, 14 Drawing Sheets

| Logical Address | Physical Address | Erased Count |
|---|---|---|
| LA 0 | block 0 | 0 |
| LA 1 | block 1 | 0 |
| LA 2 | block 2 | 0 |
| LA 3 | block 3 | 0 |
| LA 4 | block 4 | 0 |
| ...... | ...... | ...... |
| LA (N-1) | block (N-1) | 0 |

FIG. 2 (Prior Art)

MEMORY APPARATUS AND METHOD OF EVENLY USING THE BLOCKS OF A FLASH MEMORY

CROSS-REFERENCES TO RELATED APPLICATIONS

Not applicable.

BACKGROUND OF THE INVENTION

1. Field of the Invention

The present invention relates to a flash memory controller for evenly using the blocks of a flash memory and the method thereof.

2. Descriptions of the Related Art

Portable memory apparatuses, such as SD/MMC, CF, MS, XD cards, are widely applied in many applications. FIG. 1 illustrates the conventional block diagram of a memory apparatus. The memory apparatus 10 includes a memory controller 11 and a non-volatile flash memory 12. The memory controller 11 includes an interface logic 110 for interfacing the data with a host (not shown), a volatile buffer memory 112 for temporarily storing the data being written to or read from the non-volatile flash memory 12, a control logic 114 and a microprocessor 116. These circuit units 110, 112, 114 and 116 are interconnected and under the control of the microprocessor 116. The non-volatile flash memory 12 includes several units (denoted as the block) and blocks with data (denoted as the written block) that cannot directly be over-written without being erased first. In other words, only an empty block can be written.

However, each block of the flash memory 12 can only be erased a certain number of times, known as the endurance times. For example, one block may only be erased ten thousands times before the block is unavailable for further erasing. As a result, the block is no longer working. When the flash memory 12 has a failed block, it may only be read or malfunction, regardless whether or not there are any other good blocks. Generally, the number of times a block of a single-level-cell flash memory can be erased one hundred thousand times and that of a multi-level-cell flash memory is only ten thousand erase times.

FIG. 2 illustrates a lookup table for linking the logical address to the physical address. The linking table 20 may be stored in the buffer memory 112 or in the control logic 114. The linking table 20 represents the relationship between the logical address transmitted from the host and the physical address of each block of the flash memory 12. The table 20 may include the erase count corresponding to each block of the flash memory 12. The erased count represents the number of times the block has been erased or reprogrammed. Initially, the erased count corresponding to each of the blocks is zero.

FIG. 3A~3D illustrate examples of the conventional wear-leveling. In FIG. 3A, it is assumed that the flash memory 12 has data in block 0, block 1, block 2, block 3 and block 4, and a new data that is yet to be programmed or written into the flash memory 12 to replace the old data in block 1. The block 1 should be firstly erased. The erase count corresponding to the block 1 is increased by one and then new data is programmed into the block 1. As shown in FIG. 3B, data stored in the block 1 of the flash memory 12 is changed and the erase count corresponding to the block 1 is "1" now. As shown in FIG. 3C, it is understood that the erase counts corresponding to the frequently used blocks should be a large number after the flash memory 12 is reprogrammed/accessed for a long time. It has been found that the erase count corresponding to block 0 is 500, the erase count corresponding to block 1 is 1000, erase count corresponding to block 2 is 360, erase count corresponding to block 3 is 410, erase count corresponding to block 4 is 230, etc. The erase count corresponding to block 1 is a large mount because data stored in the block 1 is usually updated. The large mount also means that the data in the block 1 is hot data. Once the new data corresponds to the logical address (LA1) programmed into the block 1 again and the erased count reaches a predetermined value, for example 1000, the un-frequently used block 4 with cold data may be selected by searching for the lowest erased count to swap with the block 1. First, the cold data in the un-frequently used block 4 is first read from the block 4, temporarily stored in the buffer memory 112 and re-programmed into the block 1 after the block 1 is erased. Second, the new data is programmed into block 4 after it is also erased. Third, the relationship between LA 1, LA4, block 0 and block 4 is re-linked in the lookup table 20 as shown in FIG. 3D. It is noted that the erase count corresponding to the block 1 and block 4 are also increased by one after the swapping. By doing so, the hot data corresponding to LA 1 will be directed and programmed into the block 4 with a smaller erase count, which prevents the block 1 from malfunctioning or failing.

However, the conventional wear-leveling described above has several disadvantages. First, all of the erase counts are absolute values that need a mount of bit counts to record in the buffer memory 112 when operating the wear-leveling and to also occupy the capacity of the flash memory 12 when "blank" is recorded back into the flash memory 12. Second, comparing and searching for the block with a smaller number of erase counts impacts the performance greatly. Third, it costs one more erase count corresponding to the block with the least number of erase counts, i.e. block 4. Most importantly, conventional wear-leveling is a rough methodology that can not fully utilize every one of the blocks.

Therefore, the memory industry needs a way to manage the use of blocks and to utilize the blocks more evenly, fully, efficiently and at a low cost.

SUMMARY OF THE INVENTION

The present invention provides a method for accessing a flash memory. The flash memory is divided into a data region and a spare region. The data region includes a plurality of data blocks, while the spare region includes a plurality of spare blocks. The method comprises the following steps: receiving data corresponding to the first logical address; selecting a spare block in the spare region, programming data into the spare block; and linking the physical address of the spare block to the first logical address.

This invention also provides a method of evenly using the blocks of a flash memory. The flash memory includes a data region and a spare region. The data region has a plurality of data blocks, while the spare region has a plurality of spare blocks. The method comprises the following steps: receiving data corresponding to the first data block; selecting a spare block which is at the head sequence in the spare region; selecting a second data block when an erased count corresponding to the spare block reaches a predetermined value; programming the data stored in the second data block into the spare block; and remapping the second data block and the spare block.

This invention further provides a memory apparatus that comprises a flash memory and a controller. The flash memory includes a data region with a plurality of data blocks and a spare region with a plurality of spare blocks. The controller is configured to receive the data corresponding to the first data block, to select a spare block, to program data into the spare block when the erase count corresponding to the spare block is less than the predetermined value or to select a second data block and program data stored in the second data block into the spare block when the erase count corresponding to the spare block reaches the predetermined value. As a result, the blocks of the flash memory are used evenly.

Using this arrangement, the present invention is capable of evenly using the blocks of a flash memory, such as the data blocks and spare blocks. As a result, the life cycle of the flash memory can be improved, the data blocks and the spare blocks can be managed at a low cost, and the access performance of the flash memory is enhanced.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

FIG. 2 illustrates a lookup table for linking the logical address to the physical address;

DESCRIPTION OF THE PREFERRED EMBODIMENT

A method for accessing the flash memory, a method of evenly using the blocks of a flash memory and a memory apparatus according to this invention will now be described in greater detail.

Figure 1:
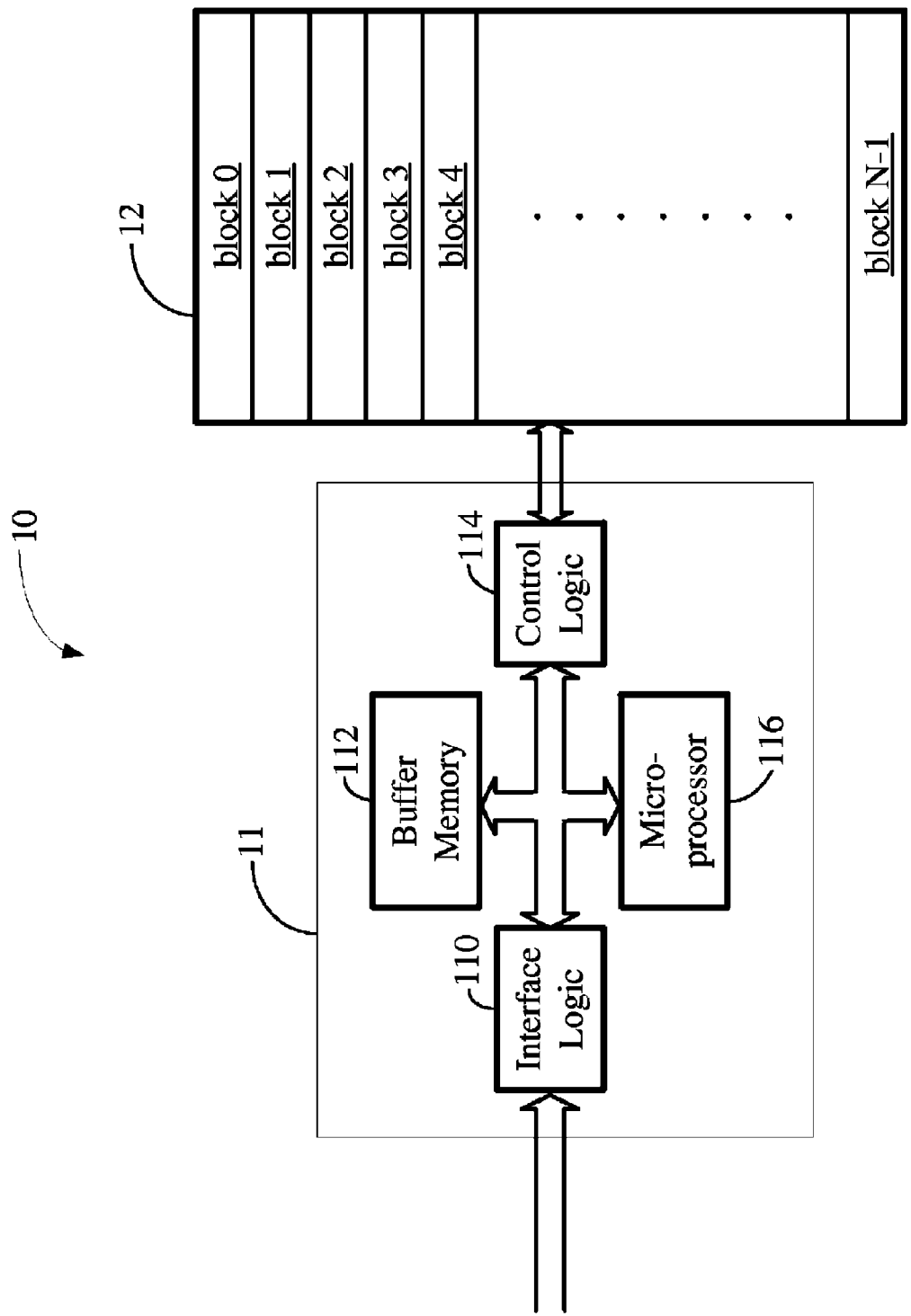
FIG. 1 is a block diagram illustrating the conventional memory apparatus.
Figure 3A:
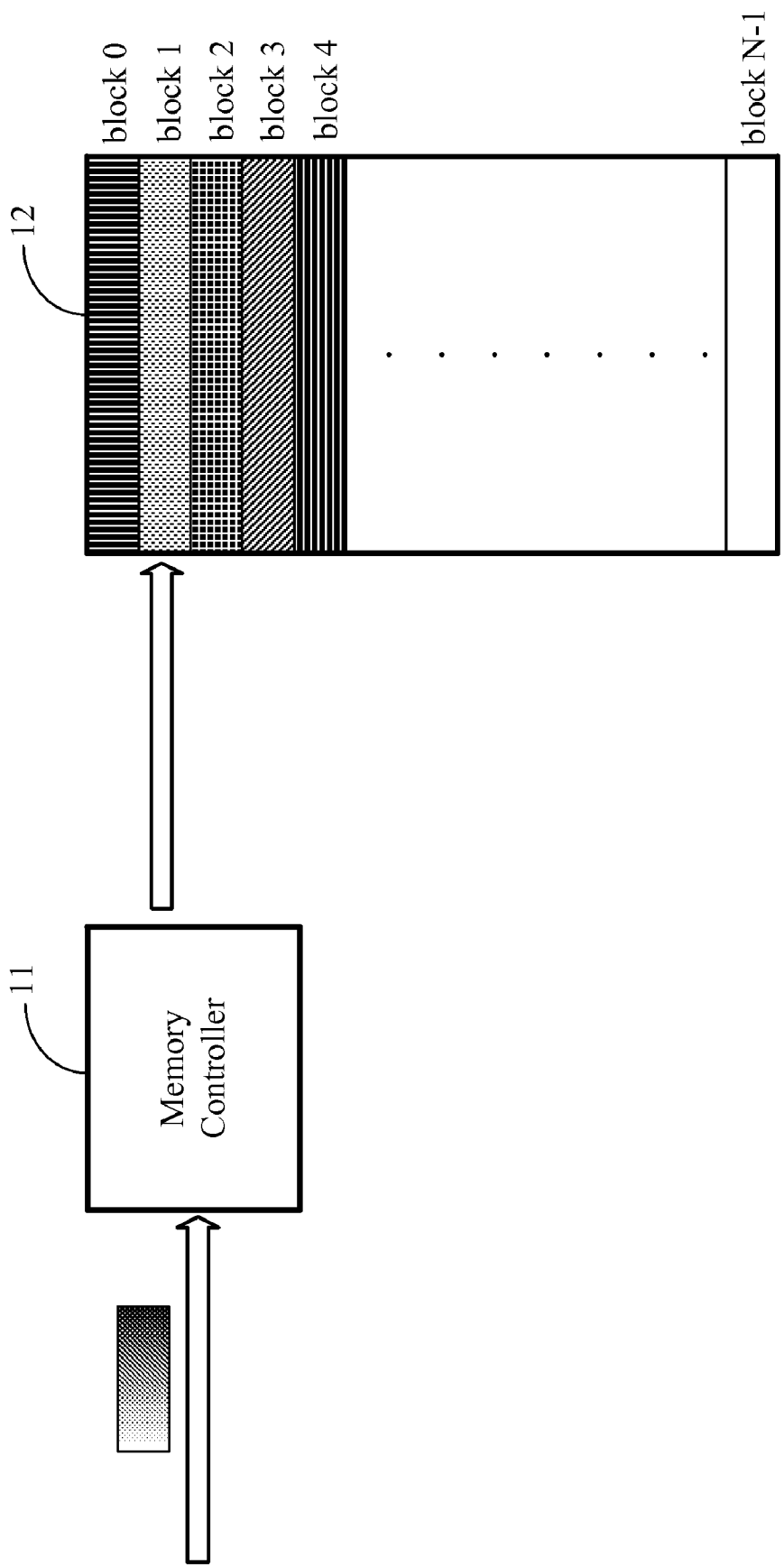
FIG. 3A~3D illustrate an example of conventional wear-leveling.
Figure 3B:
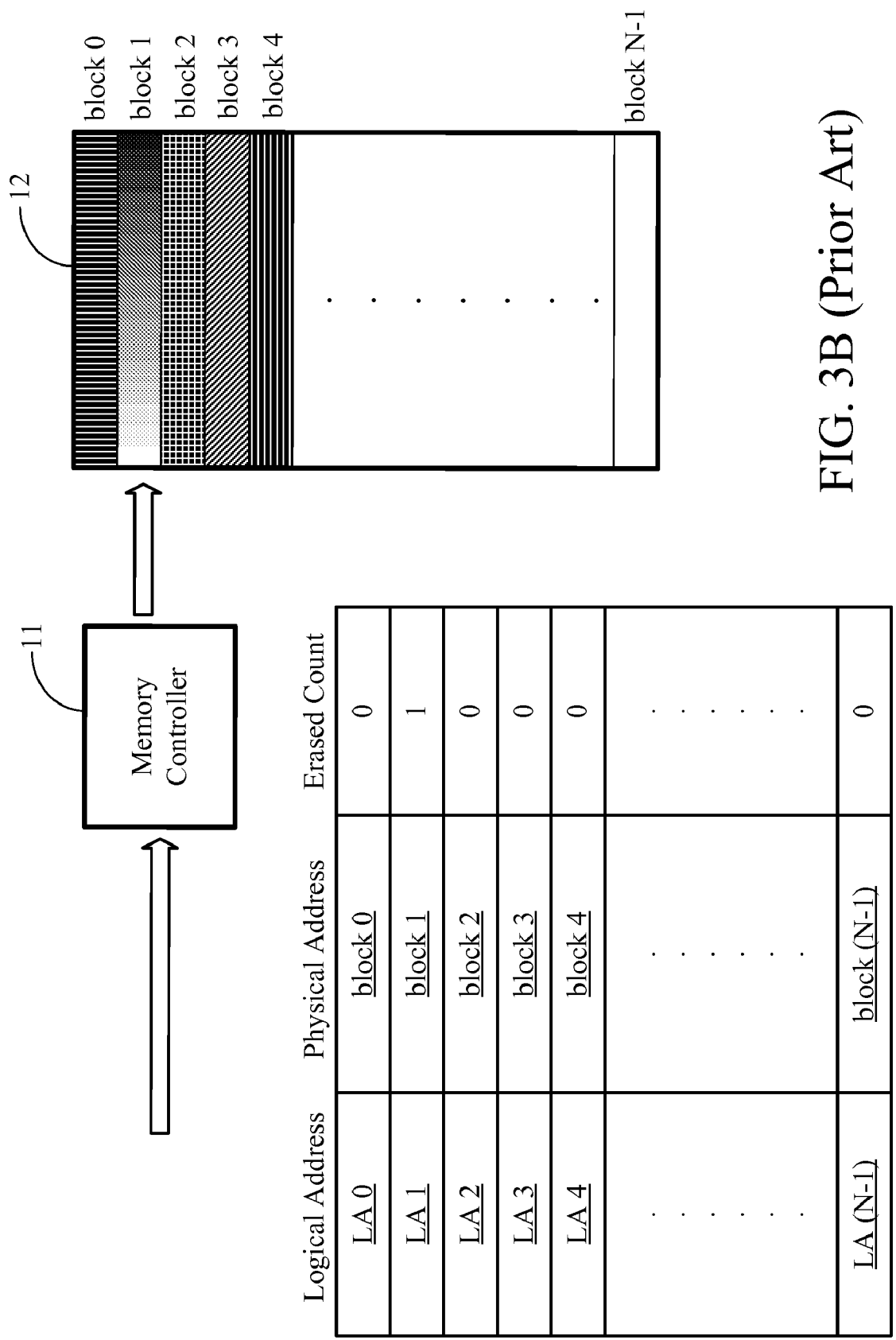
Figure 3C:
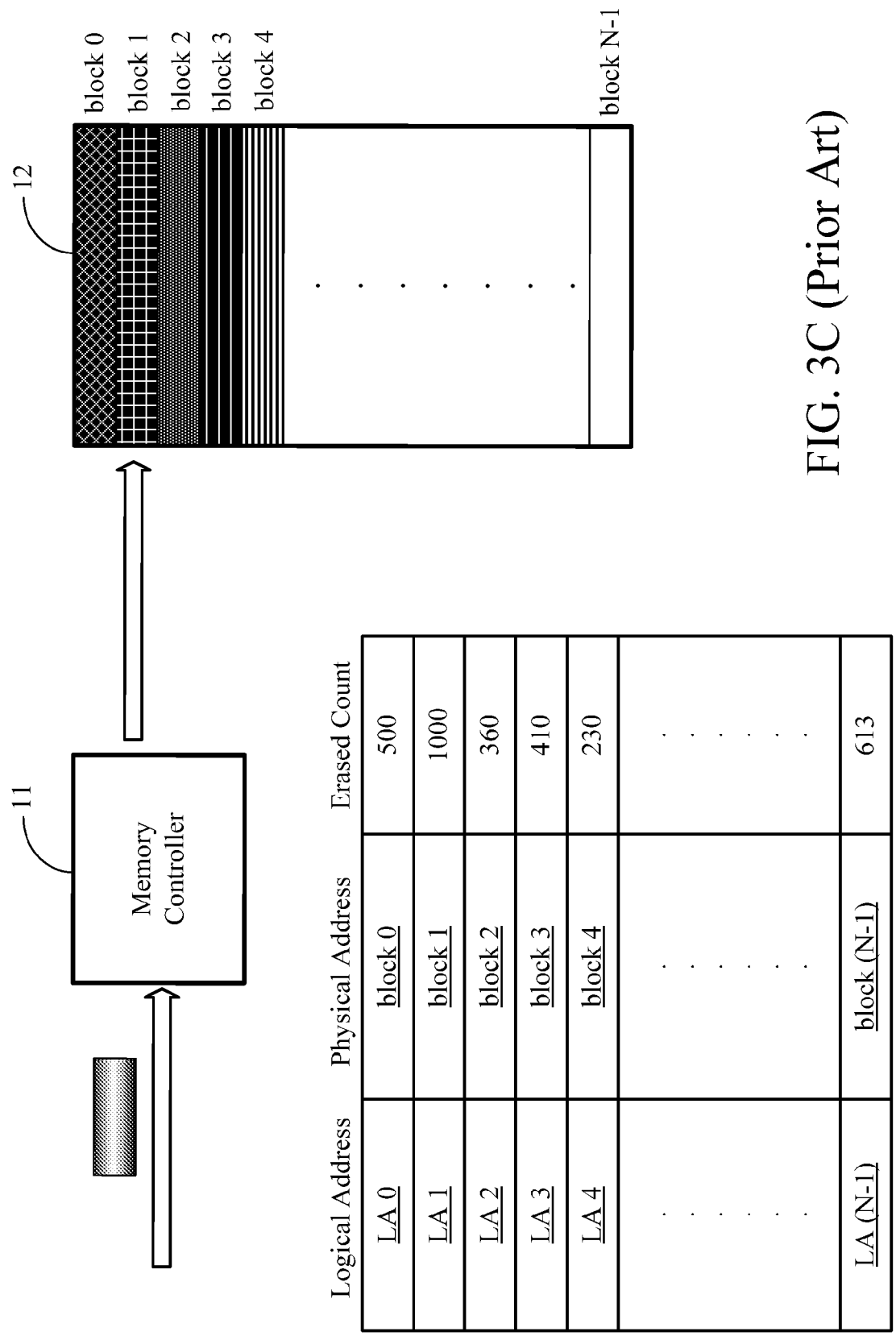
Figure 3D:
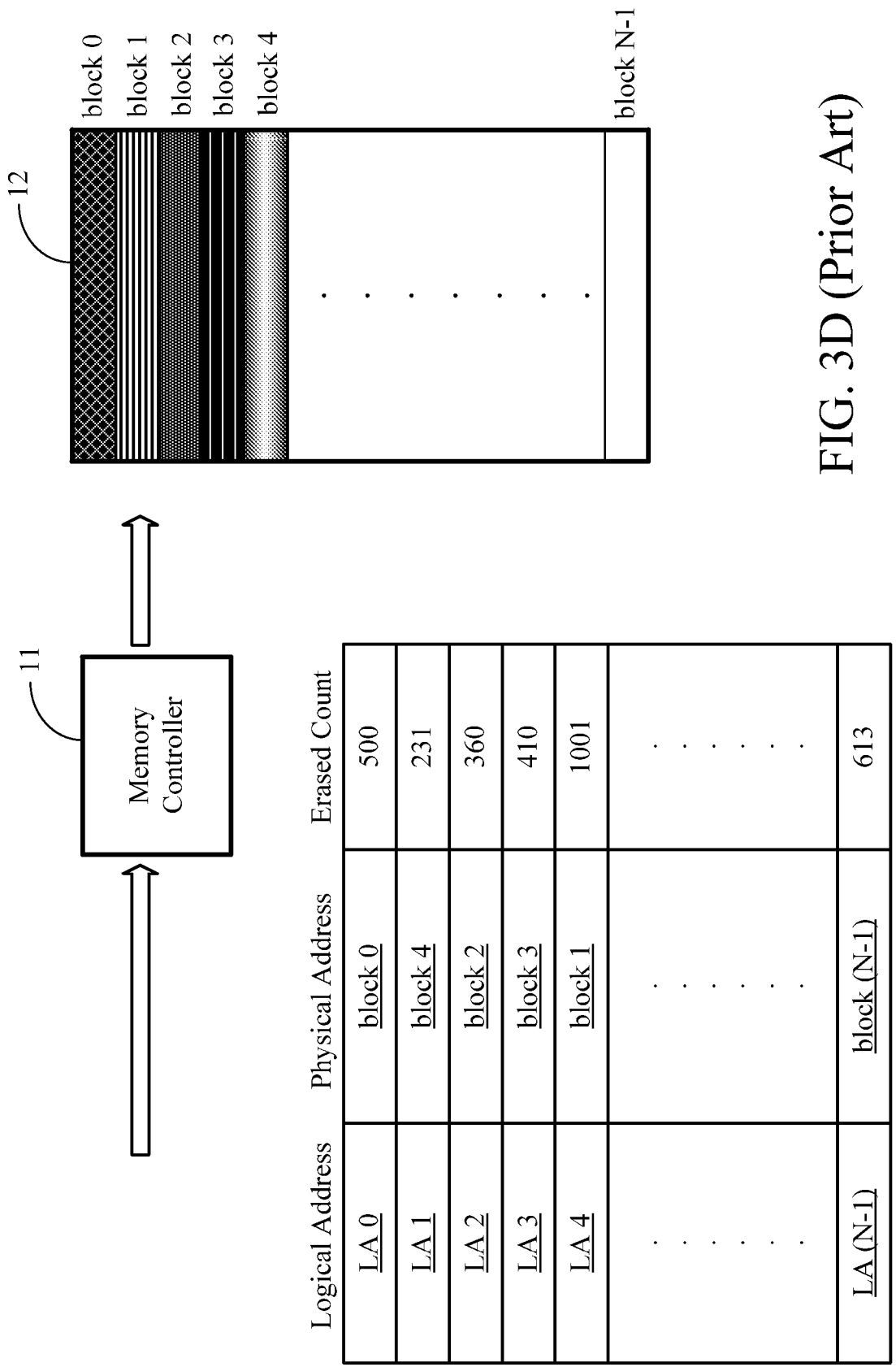
Figure 4:
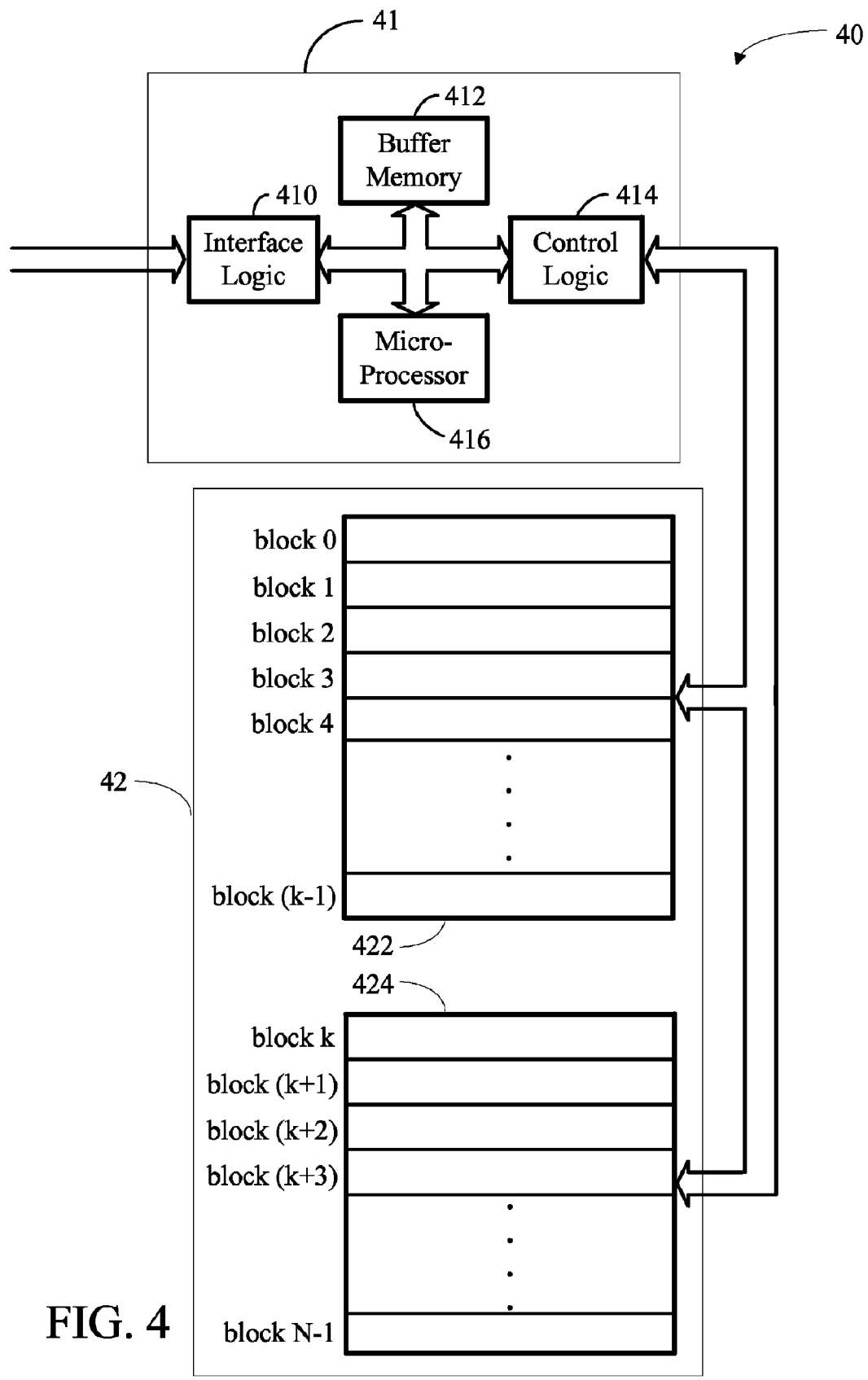
FIG. 4 illustrates a memory apparatus according to one embodiment of the present invention.

FIG. 4 illustrates the block diagram of a memory apparatus according to the present invention. The memory apparatus 40 includes a memory controller 41 and a non-volatile flash memory 42. The memory controller 41 includes an interface logic 410 for interfacing the data with a host (not shown), a volatile buffer memory 412 for temporarily storing the data being written to or read from the non-volatile flash memory 42, a microprocessor 416 and a control logic 414. These circuit units 410, 412, 414 and 416 are interconnected and under the control of the microprocessor 416. The non-volatile flash memory 42 is divided into the data region 422 and spare region 424. The data region 422 includes a plurality of data blocks, while the spare region 424 includes a plurality of spare blocks. For example, the data region includes "k" data blocks and the spare region includes "(N−k)" spare blocks.

Figure 5:
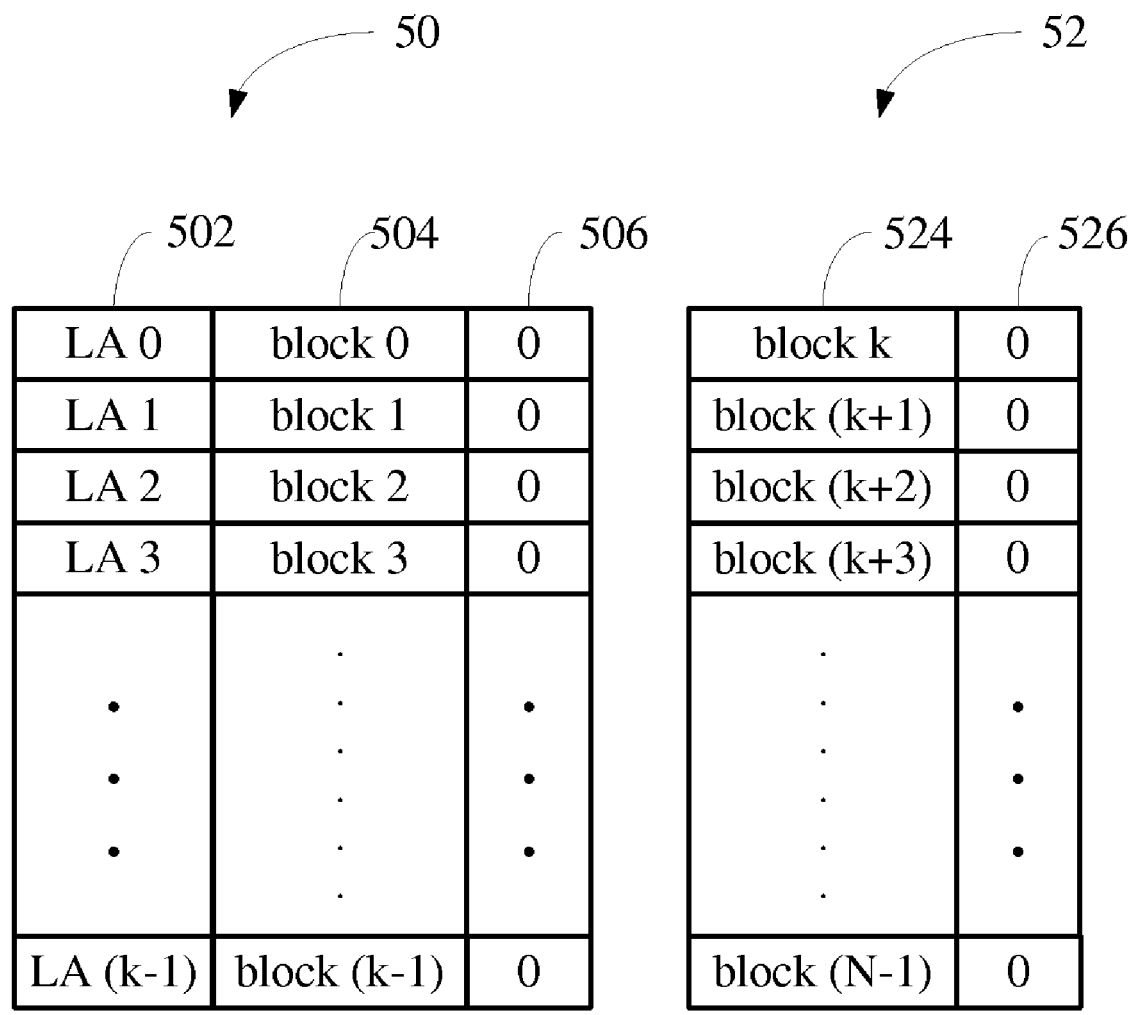
FIG. 5 illustrates the mapping tables of the data blocks and spare blocks according to the present invention.

FIG. 5 illustrates the mapping tables of the data blocks and spare blocks according to the present invention. The mapping table of the data blocks includes logical address column 502, physical address column 504 and erased count column 506. The mapping table of the spare blocks includes the physical address column 524 and the erase count column 526. In the initial situation of this embodiment, the logical address LA 0 links to the physical address block 0, the logical address LA 1 links to the physical address block 1, the logical address LA 2 links to the physical address block 2 and so on. However the many physical addresses that correspond to the spare blocks are not linked to the logical address. Further, the erase counts corresponding to each of blocks are zero.

Figure 6A:
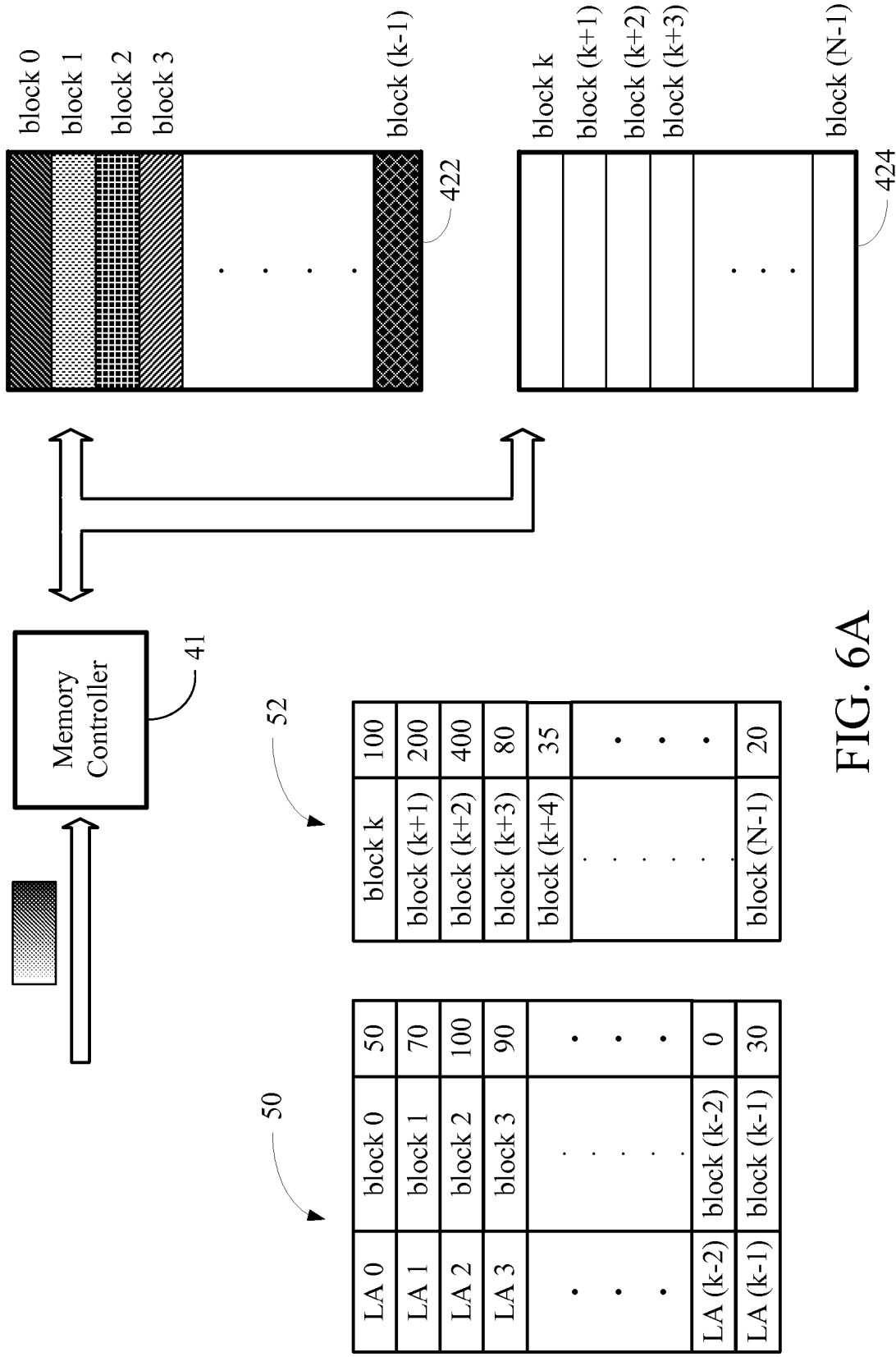
FIG. 6A~6D illustrates the examples of accessing the non-volatile flash memory according to the present invention.

FIG. 6A~6D illustrate examples of accessing a non-volatile flash memory according to the present invention. In FIG. 6A, each one of the data blocks in the data region 422 is filled with data, and each one of the spare blocks is empty. On one hand, the logical address LA 0 links to the physical block 0 with an erase count of 50, LA 1 links to block 1 with an erased count of 70, LA 2 links to block 2 with an erase count of 100 and so on. On the other hand, the mapping table 52 for spare blocks shows the physical block "k" with an erase count of 100, the physical block (k+1) has an erase count 200, the physical block (k+2) has an erase count 400, and so on.

Figure 6B:
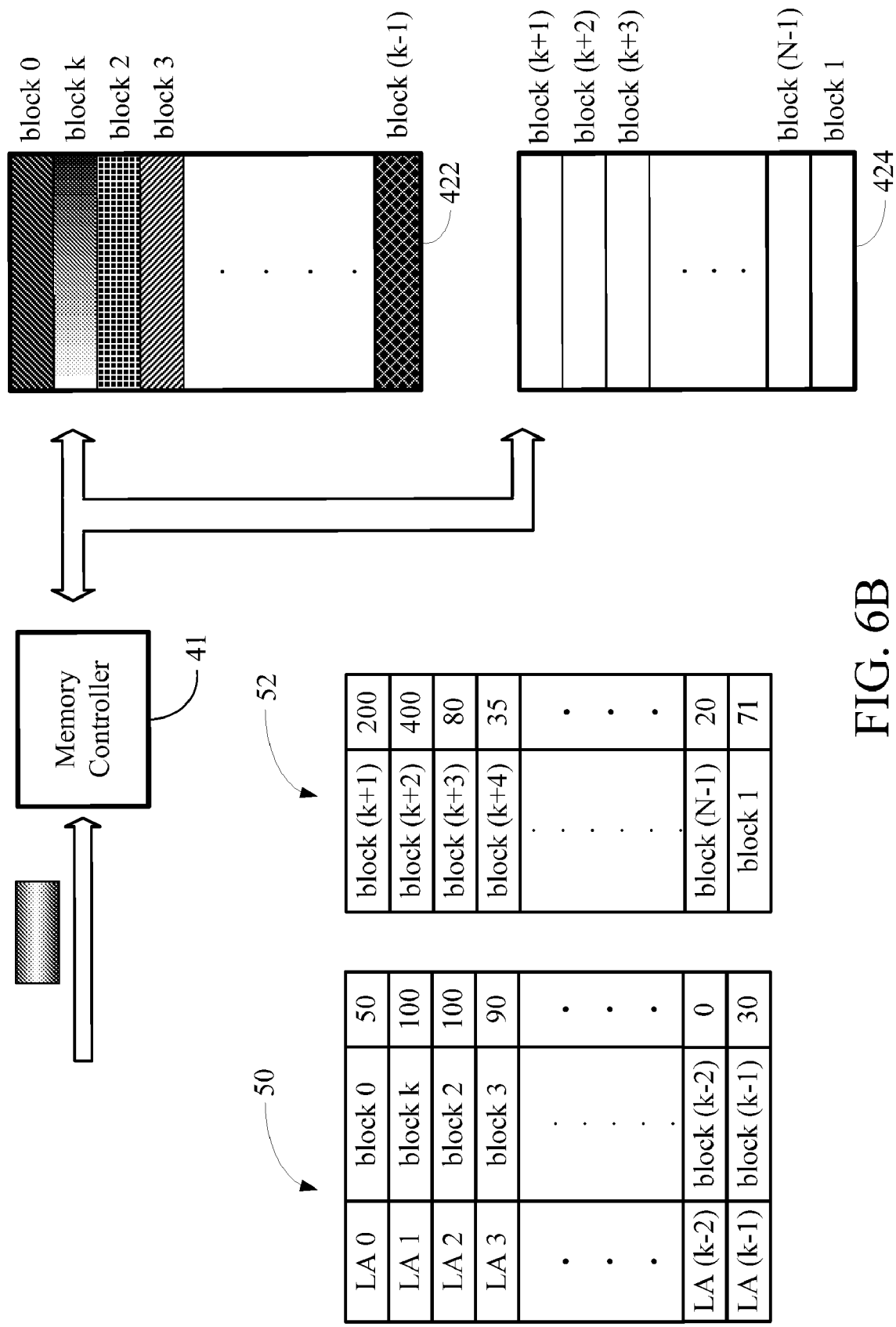

When the data with a logical address LA 1 is transmitted from a host (not shown), the memory controller 41 temporarily stores data in the buffer memory 412, and then selects a spare block in the spare region 424 to program/store the data. In this embodiment, the spare block is at the head sequence in the spare region 424 when the erase count of the spare block is less than the predetermined value, for example, 400. In other words, the physical address of the spare block is block "k" because the erased count of the spare block is 100 less than 400. Then, the controller 41 remaps the relationship between the data block of the physical address block 1 and the spare block of physical address block "k" correspondingly. That is, the controller 41 links the logical address LA 1 to the physical address block "k". In another embodiment, the data block corresponding to the physical address block 1 may be erased and recycled at the tail sequence in the spare region 424. As shown in FIG. 6B, the data region 422 is drawn to include a block corresponding to the physical address block "k". The spare region 424 is drawn to include a block corresponding to the physical address block "1". It is also noted that LA 1 is linked with block "k" in the mapping table 50 and the physical address block "1" with an erase count of 71 is recorded into the mapping table 52.

Figure 6C:
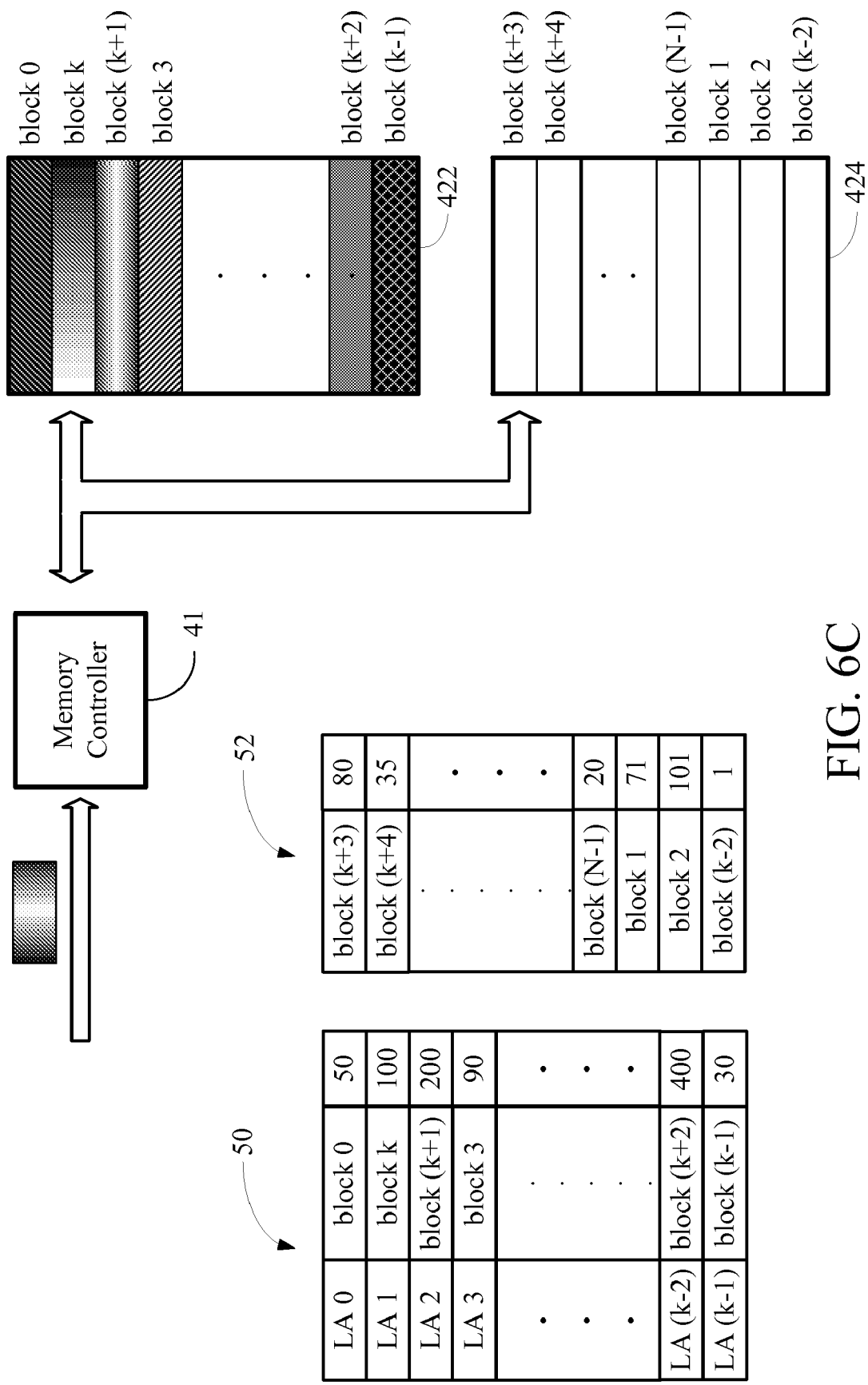

Continuously, new data with a logical address LA 2 being transmitted from a host (not shown), the memory controller 41 temporarily stores data in the buffer memory 412, and then selects a spare block in the spare region 424 to program/store data into thereof. In this embodiment, the spare block is at the head sequence in the spare region 424. In other words, the physical address of the spare block is block (k+1) when the erase count of the spare block is less than the predetermined value, for example, 400. Then, the memory controller 41 remaps the relationship between the data block of the physical address block 2 and the spare block of the physical address block (k+1) correspondingly. That is, the controller 41 links the logical address LA 2 to the physical address block (k+1). In another embodiment, the data block corresponding to the physical address block 2 may be erased and recycled at the tail sequence in the spare region 424. As shown in FIG. 6C, the data region 422 is drawn to include a block corresponding to physical address block (k+1). The spare region 424 is drawn to include a block corresponding to the physical address block 2. It is also noted that LA 2 is linked with block (k+1) in the mapping table 50 and the physical address block 2 with an erase count of 101 is recorded in the mapping table 52.

Continuously, new data with logical address LA 3 being transmitted from a host (not shown), the memory controller 41 temporarily stores data in the buffer memory 412, and then selects a spare block in the spare region 424 to program/store data into thereof. However, the erase count of the spare block at the head sequence in the spare region 424 reaches a predetermined value, for example, 400. The memory controller 41 searches for a data block in which the erase count equals zero in the data region 422. If there is no data block which has a zero erased count, the memory controller 41 will subtract one from all the erase counts corresponding to all of the blocks and search again. In the embodiment, the data block corresponding to the block (k−1) is selected because of the zero erase count. Then, the memory controller 41 remaps the data block corresponding to the physical address block (k−1) with the spare block corresponding to the physical address block (k+2). That is, the memory controller reads data stored in the block (k−1) and programs/writes data into the spare block corresponding to the physical address block (k+2). At the same time, the memory controller 41 links the logical address LA (k−2) to the physical address block (k+2). In another embodiment, the data block corresponding to the physical address block (k−2) may be erased and recycled at the tail sequence in the spare region 424. As shown in FIG. 6C, the data region 422 is drawn to include a block corresponding to the physical address block (k+2). The spare region 424 is drawn to include a block corresponding to the physical address block (k−2). It is also noted that LA (k−2) is linked with block (k+2) in the mapping table 50 and the physical address block (k−2) with an erase count of 1 is recorded into the mapping table 52.

Figure 6D:
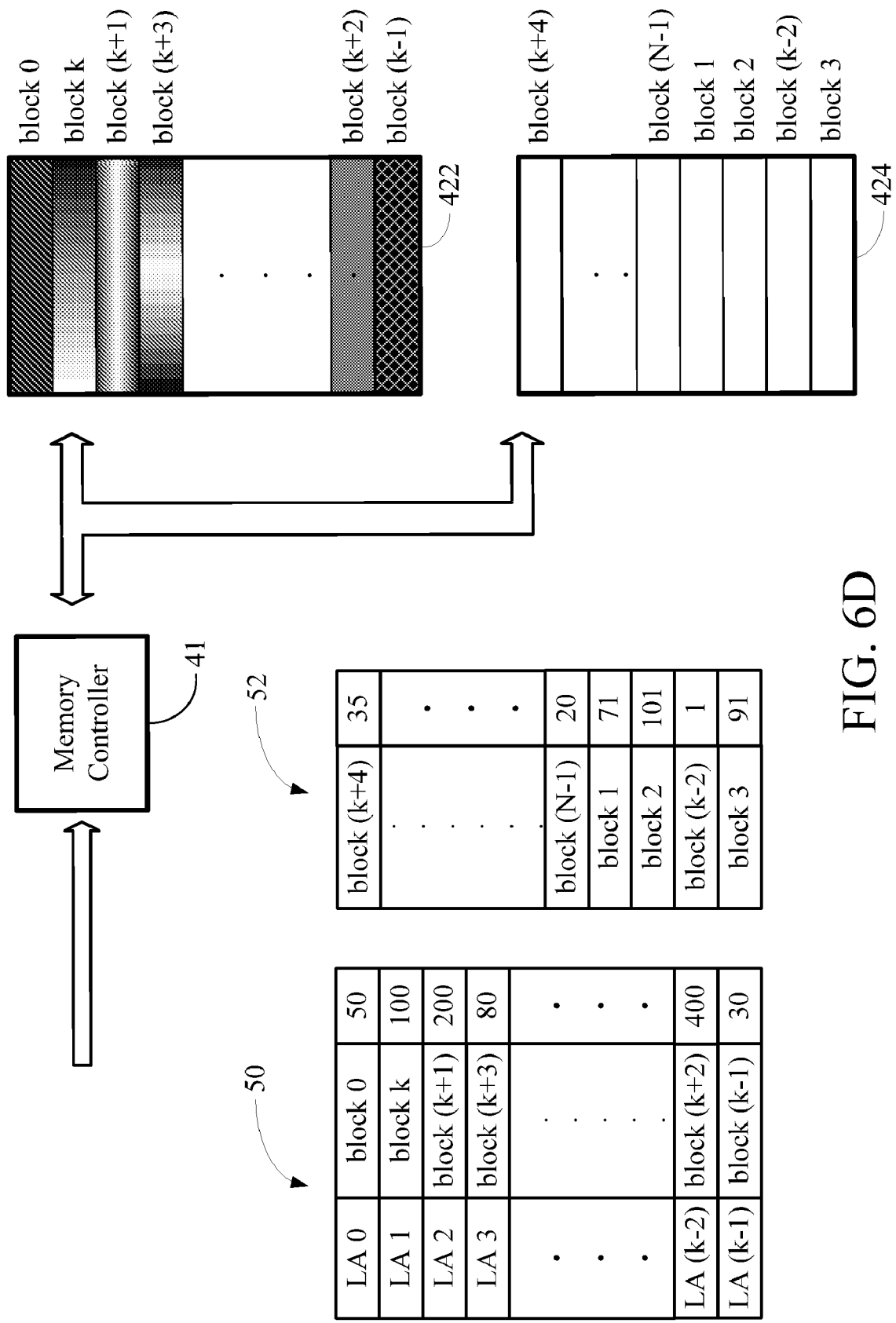

After remapping data block (k−2) with the spare block (k+2), the memory controller 41 further selects a spare block at the head sequence in the spare region 424 to program/store data into thereof. At this time, the spare block corresponding to the physical address block (k+3) with an erase count of 80 less than a predetermined value 400 is selected. The memory controller 41 then programs data stored in the buffer memory 412 into the spare block corresponding to the physical address block (k+3) and remaps the relationship between the data block of the physical address block 3 and the spare block of physical address block (k+3) correspondingly. That is, the controller 41 links the logical address LA 3 to the physical address block (k+3). In another embodiment, the data block corresponding to the physical address block 3 may be erased and recycled at the tail sequence in the spare region 424. As shown in FIG. 6D, the data region 422 is drawn to include a block corresponding to the physical address block (k+3). The spare region 424 is drawn to include a block corresponding to the physical address block 3. It is also noted that LA 3 is linked with block (k+3) in the mapping table 50 and the physical address block 3 with an erase count of 91 is recorded into the mapping table 52.

Figure 7:
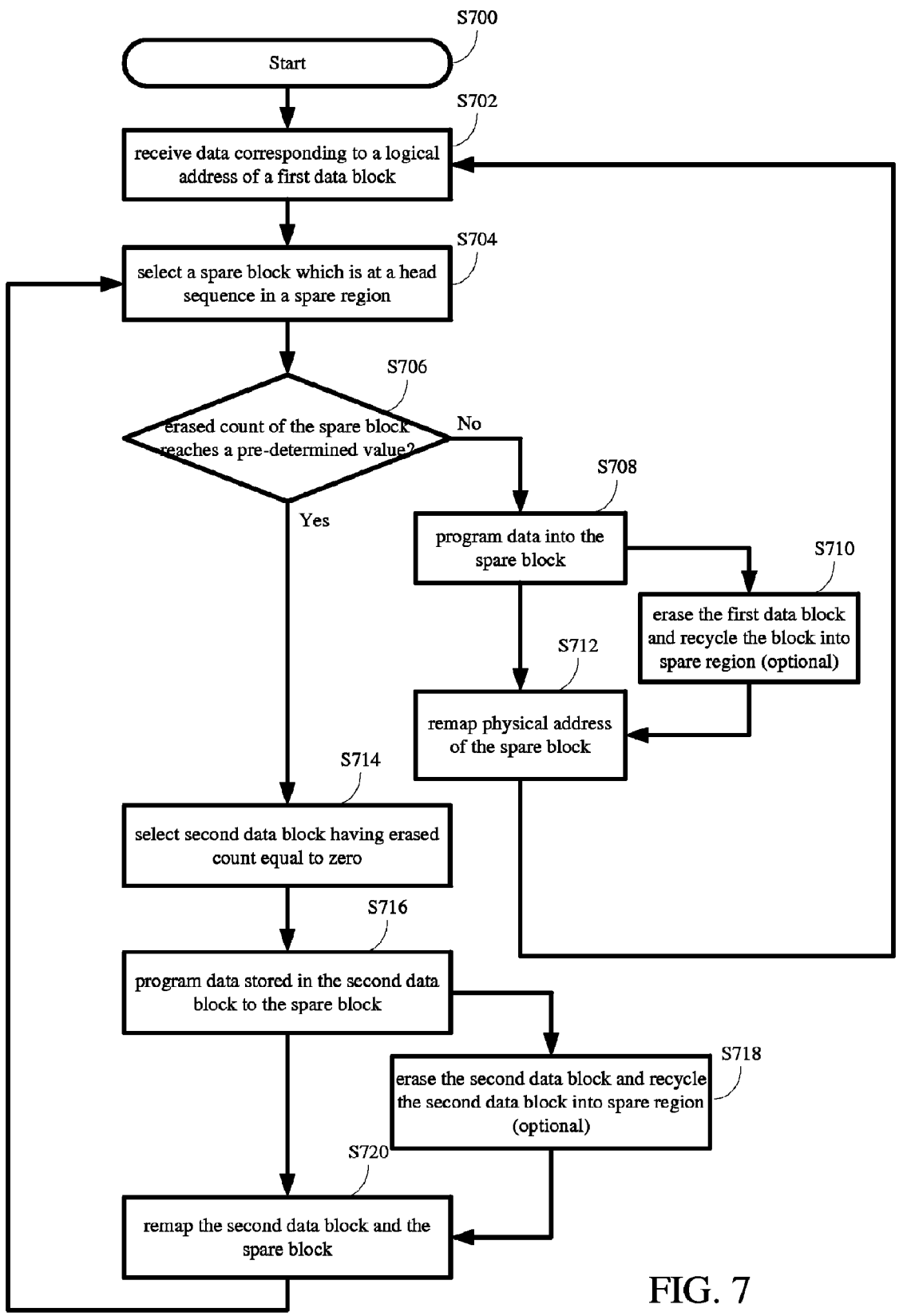
FIG. 7 is a flow chart illustrating the method for accessing a flash memory according to the embodiment of this invention.

FIG. 7 is a flow chart illustrating the method for accessing a flash memory according to an embodiment of this invention. It summarizes the foregoing description. In step S702, the memory controller 41 first receives data corresponding to the logical address of the first data block from the host. In step S704, the memory controller 41 selects a spare block which is at the head sequence in the spare region 424. In step S706, the memory controller 41 determines the erased count of the spare block reaches a pre-determined value, for example, 400. If so, the method proceeds to step S714, otherwise, the method proceeds to step S708. In step S708, the memory controller 41 programs data into the spare block when an erased count corresponding to the spare block is less than 400. In step S710, the memory controller 41 erases the first data block and recycles the first data block at the tail sequence into the spare region 424. This step is optional.

In step S712, the memory controller 41 remaps the physical address of the spare block. That is, the memory controller 41 links the physical address of the spare block to the first logical address. After step S712, the method goes to step S702. In step S714, the memory controller 41 selects a second data block with an erased count equal to zero when an erased count corresponding to the spare block reaches the predetermined value, for example, 400. In step S716, the memory controller 41 programs the data stored in the second data block into the spare block. In step S718, the memory controller 41 erases the second data block and recycles the second data block at the tail sequence into the spare region 424. This step is optional.

In step S720, the memory controller 41 remaps the second data block and the spare block. That is, the memory controller 41 links the logical address of second data block to the physical address of the spare block. After step S720, the method goes to step S704 to further process the data corresponding to a logical address of the first data block. The method may go to step S708 if the erased count corresponding to the following spare block is less than 400. The predetermined value may be preset in the firmware stored in the memory controller 41 or in one of the blocks of the flash memory 42. The predetermined value may also be a fixed value, ex: 400, or a ranged value, ex: ±5% of 400.

Figure 8:
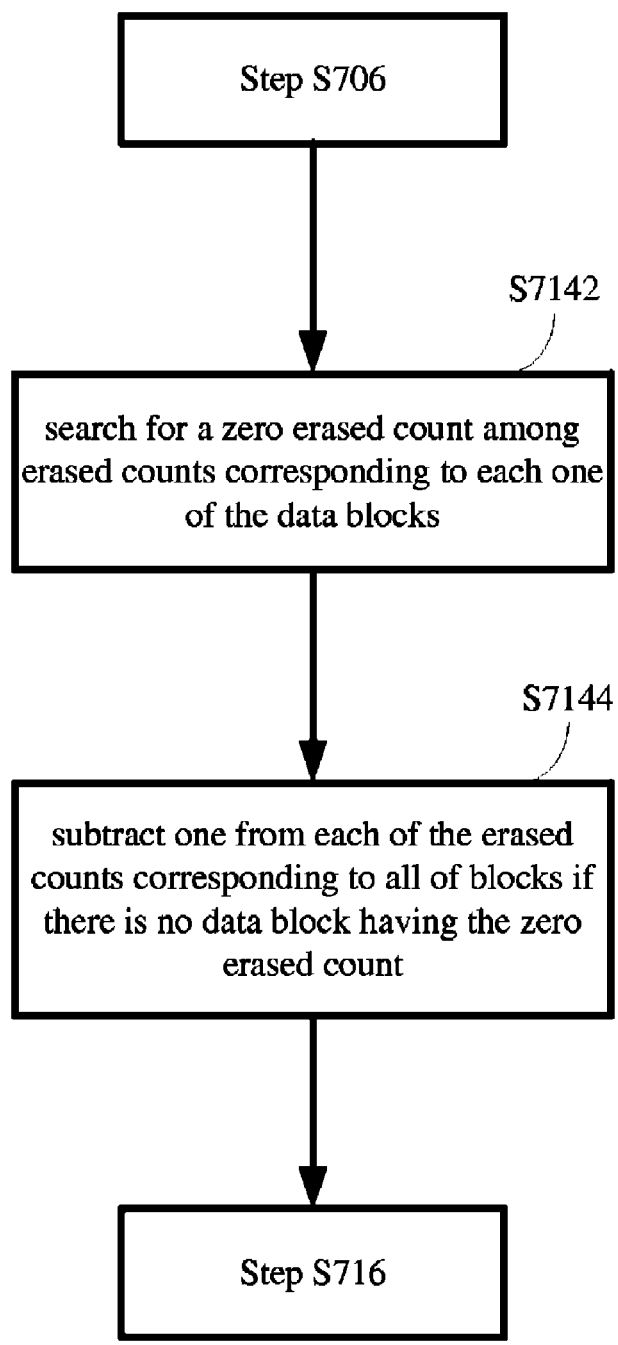
FIG. 8 is a flow chart illustrating the method of selecting the second data block in step S714 shown in FIG. 7 according to the embodiment of the invention.

FIG. 8 illustrates a method for selecting the second data block in step S714 shown in FIG. 7 according to an embodiment of the invention. In step S7142, the memory controller 41 searches for a zero erase count among erased counts corresponding to each one of the data blocks. If there is no data block with the zero erased count, the memory controller 41 subtracts one from each of the erased counts corresponding to all of the blocks. Until the erase count corresponding to one of the data blocks equals zero, the data block would be selected by the memory controller 41. By doing so, this invention has several advantages. First, the erase counts are relative values and the cost bit count is less than the prior art. That means that not only is less capacity needed to record the flash memory, but also that the buffer memory 412 requires less capacity during operation. Second, the memory controller 41 does not need to compare all of the erased counts to find out that the data block has the number as described in the background. The performance of the whole system is also enhanced.

Accordingly, the present invention is capable of evenly using the blocks of a flash memory, such as the data blocks and spare blocks. As a result, the life cycle of the flash memory can be improved, the data blocks and the spare blocks in the flash memory can be managed at a low cost, and the access performance of the flash memory is enhanced.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A memory apparatus, comprising:
    a flash memory including a data region having a plurality of data blocks arranged in a contiguous sequence and a spare region having a plurality of spare blocks arranged in a contiguous sequence, wherein each of the data blocks is filled with data, and each of the spare blocks is empty; and
    a controller being configured to receive data corresponding to a first logical address which is initially linked to a physical address of a first data block of the data blocks, to select one of the spare blocks, when an erased count corresponding to the spare block is less than a predetermined value, to program data directly into the selected spare block, and to link a physical address of the selected spare block to the first logical address, whereby the data blocks and spare blocks of the flash memory are used in an even manner, and wherein the controller is further configured to erase the first data block and to recycle the first data block at a tail sequence in the spare region.

2. The memory apparatus of claim 1, the controller further comprising a buffer memory for temporarily storing linking information about logical address and physical address of the blocks of the flash memory.

3. The memory apparatus of claim 2, wherein the linking information includes a plurality of erased counts corresponding to physical addresses of each of the data blocks and spare blocks, the linking information with erased counts being stored into one of the data blocks or spare blocks of flash memory after an access operation.

4. The memory apparatus of claim 3, wherein the erased counts are relative value, not absolute value.

5. The memory apparatus of claim 1, wherein the predetermined value is a fixed value or a ranged value, which is preset in a firmware stored in the flash memory or in the controller.

6. A memory apparatus, comprising:
a flash memory including a data region having a plurality of data blocks and a spare region having a plurality of spare blocks, wherein each of the data blocks is filled with data, and each of the spare blocks is empty; and
a controller being configured to receive data corresponding to a first logical address which is initially linked to a physical address of a first data block of the data blocks, and to select one of the spare blocks in which the selected spare block is at a head sequence, when an erased count corresponding to the selected spare block reaches a predetermined value, the controller being further configured to select a second data block from the data blocks, by searching for a zero erased count among a plurality of erased counts corresponding to each one of the data blocks, to subtract one from each of the erased counts corresponding to each of the data blocks if there is no data block having the zero erased count, and to program data stored in the second data block into the selected spare block, to remap the second data block and the selected spare block by linking a physical address of the selected spare block to a second logical address of the second data block, whereby the data blocks and spare blocks of the flash memory are used in an even manner.

7. The memory apparatus of claim 6, wherein when an erased count corresponding to the selected spare block reaches a predetermined value, the controller is further configured to erase the second data block and to recycle the second data block at a tail sequence in the spare region.

8. The memory apparatus of claim 7, wherein the controller is further configured to select a next spare block which is in turn at the head sequence in the spare region, to program data into the next selected spare block, to link a physical address of the next selected spare block to the first logical address, to erase the first data block, and to recycle the first data block at the tail sequence in the spare region.

9. A method of evenly using blocks of a flash memory, comprising the steps of:
dividing the flash memory into a data region and a spare region, the data region including a plurality of data blocks and the spare region including a plurality of spare blocks, wherein each of the data blocks is filled with data, and each of the spare blocks is empty;
receiving data corresponding to a first logical address which is initially linked to a physical address of a first data block of the data blocks;
selecting one of the spare blocks in which the selected spare block is at a head sequence in the spare region;
selecting a second data block from the data blocks, by searching for a zero erased count among a plurality of erased counts corresponding to each one of the data blocks, when an erased count corresponding to the selected spare block reaches a predetermined value, wherein one is subtracted from each of the erased counts corresponding to each of the data blocks if there is no data block having the zero erased count;
programming data stored in the second data block into the selected spare block; and
remapping the second data block and the selected spare block by linking a physical address of the selected spare block to a second logical address of the second data block.

10. The method of claim 9, wherein erased count corresponding to the second data block equals to zero.

11. The method of claim 9, wherein the step of remapping further comprising the steps of:
erasing the second data block; and
recycling the second data block at a tail sequence in the spare region.

12. The method of claim 9, wherein the predetermined value is a fixed value or a ranged value, which is preset in a firmware stored in the flash memory or in a controller.

* * * * *